(12) United States Patent
Xiong et al.

(10) Patent No.: US 11,432,404 B2
(45) Date of Patent: Aug. 30, 2022

(54) FLEXIBLE PRINTED CIRCUIT (FPC) BOARD AND METHOD FOR MANUFACTURING THE SAME AND OLED DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Rui Xiong, Wuhan (CN); Jiangkun Cheng, Wuhan (CN)

(*) Notice: Subject to any disclaimer, the term of this patent is extended or adjusted under 35 U.S.C. 154(b) by 422 days.

(21) Appl. No.: 16/609,217

(22) PCT Filed: Feb. 21, 2019

(86) PCT No.: PCT/CN2019/075646
§ 371 (c)(1),
(2) Date: Oct. 29, 2019

(87) PCT Pub. No.: WO2020/118897
PCT Pub. Date: Jun. 18, 2020

(65) Prior Publication Data
US 2020/0404788 A1    Dec. 24, 2020

(30) Foreign Application Priority Data

Dec. 14, 2018  (CN) .......................... 201811535775.3

(51) Int. Cl.
| H05K 1/11 | (2006.01) |
| H01L 51/52 | (2006.01) |
| H05K 1/18 | (2006.01) |
| H05K 3/24 | (2006.01) |
| H05K 3/28 | (2006.01) |
| H05K 1/09 | (2006.01) |

(Continued)

(52) U.S. Cl.
CPC .............. *H05K 1/118* (2013.01); *H01L 24/16* (2013.01); *H01L 51/5203* (2013.01);
(Continued)

(58) Field of Classification Search
CPC ...................................................... H01L 24/16
See application file for complete search history.

(56) References Cited

U.S. PATENT DOCUMENTS

| 9,741,961 B2 * | 8/2017 | Kim ...................... H01L 51/524 |
| 2005/0039945 A1 * | 2/2005 | Matsuda ............. H01L 23/4985 |
| | | 174/254 |

(Continued)

FOREIGN PATENT DOCUMENTS

| CN | 103140025 A | 6/2013 |
| CN | 104461152 A | 3/2015 |
| CN | 106530991 A | 3/2017 |

*Primary Examiner* — William A Harriston

(57) ABSTRACT

A FPC board and a method for manufacturing the same and an OLED display device are provided. The FPC board includes a substrate, a first wire layer disposed on one side of the substrate, a circuit board terminal disposed at an edge on one side of the substrate and connected to the first wire layer, and a first protective layer covering the first wire layer. The thickness of the circuit board terminal is larger than the sum of the thicknesses of the first wire layer and the first protective layer. When the FPC board is connected to the OLED panel, one side of the base substrate on which the panel terminal is provided is opposite to one side of the substrate on which the circuit board terminal is provided, such that the base substrate overlaps with the substrate to connect the circuit board terminal and the panel terminal.

9 Claims, 3 Drawing Sheets

(51) Int. Cl.
*H05K 3/02* (2006.01)
*H01L 23/00* (2006.01)

(52) U.S. Cl.
CPC ............ *H05K 1/189* (2013.01); *H05K 3/244* (2013.01); *H05K 3/28* (2013.01); *H01L 2224/16225* (2013.01); *H01L 2224/16505* (2013.01); *H05K 1/09* (2013.01); *H05K 3/022* (2013.01); *H05K 2201/0154* (2013.01); *H05K 2201/0347* (2013.01); *H05K 2201/10128* (2013.01); *H05K 2203/0723* (2013.01)

(56) References Cited

U.S. PATENT DOCUMENTS

| | | | | |
|---|---|---|---|---|
| 2007/0222366 | A1* | 9/2007 | Park | G09G 3/3225 313/500 |
| 2011/0199348 | A1* | 8/2011 | Takatani | H04M 1/18 445/24 |
| 2013/0148312 | A1* | 6/2013 | Han | H05K 1/028 361/736 |
| 2013/0273292 | A1* | 10/2013 | Kim | B32B 3/30 428/354 |
| 2013/0306459 | A1* | 11/2013 | Anno | G06F 3/0443 200/600 |
| 2013/0341597 | A1 | 12/2013 | Kim | |
| 2015/0226995 | A1* | 8/2015 | Aota | H01L 24/83 349/149 |
| 2015/0241729 | A1* | 8/2015 | Kim | G02F 1/13452 349/12 |
| 2017/0279084 | A1* | 9/2017 | Sakamoto | H01L 27/3258 |
| 2018/0082929 | A1* | 3/2018 | Lai | H01L 23/49855 |
| 2018/0307369 | A1* | 10/2018 | Park | H05K 1/189 |
| 2018/0356917 | A1* | 12/2018 | Lee | H05K 3/285 |
| 2019/0036075 | A1* | 1/2019 | Jiang | H01L 51/0097 |
| 2020/0166801 | A1* | 5/2020 | Qiu | G02B 6/005 |

* cited by examiner

FLEXIBLE PRINTED CIRCUIT (FPC) BOARD AND METHOD FOR MANUFACTURING THE SAME AND OLED DISPLAY DEVICE

FIELD OF INVENTION

The present invention generally relates to the display technology and, more particularly, to a flexible printed circuit (FPC) board and a method for manufacturing the same and an organic light-emitting diode (OLED) display device.

BACKGROUND OF INVENTION

Organic light-emitting diode (OLED) display devices have been considered as the most promising display devices in the industry because they have many advantages such as self-luminescence, low driving voltage, high luminescent efficiency, short response time, high definition and contrast, near 180° viewing angle, wide temperature range, the feasibility of flexible and large-area full-color display, and so on.

Based on the driving methods, OLEDs can be classified into two types: the passive-matrix OLED (PMOLED) and the active-matrix OLED (AMOLED), namely the direct-addressing type and thin-film transistor (TFT) matrix addressing type. Among them, the AMOLED has pixels arranged in an array, which belongs to the active-matrix display type, has high luminescent efficiency, and is usually used as a high-definition large-sized display device.

An OLED display device generally includes a substrate, an anode disposed on the substrate, a hole-injection layer disposed on the anode, a hole-transport layer disposed on the hole-injection layer, a light-emitting layer disposed on the hole-transport layer, an electron-transport layer disposed on the light-emitting layer, an electron-injection layer disposed on the electron-transport layer, and a cathode disposed on the electron-injection layer. The principle of luminescence of an OLED display device is that carriers are driven by the electric field to inject and recombine in the semiconductor materials and the organic luminescent materials to cause luminescence. Specifically, an OLED display device generally uses an indium-tin oxide (ITO) pixel electrode and a metal electrode as the anode and the cathode of the device, respectively. Under a certain driving voltage, electrons and holes are respectively injected from the cathode and the anode to the electron-transport layer and the hole-transport layer. Electrons and holes migrate and meet in the light-emitting layer through the electron-transport layer and the hole-transport layer, respectively, to form excitons to excite the light-emitting molecules and emit visible light through radiation relaxation.

In the prior art, a flexible substrate made of polyimide (PI) is generally formed on a rigid substrate, and a thin-film transistor (TFT) layer and an OLED layer are manufactured on the flexible substrate to form an OLED mainboard. Then, the OLED mainboard undergoes laser cutting to acquire a plurality of OLED panels. A FPC board is provided and connected to the OLED panel to test the OLED panel. Please refer to FIG. 1, which is a schematic structural diagram of a FPC board for connecting and testing an OLED panel. The FPC board 100 includes a substrate 110, a first wire layer 120 disposed on one side of the substrate 110, a circuit board terminal 130 disposed at an edge on the one side of the substrate 110 and connected to the first wire layer 120, a first protective layer 140 covering the first wire layer 120, a second wire layer 150 disposed on the other side of the substrate 110, and a second protective layer 160 covering the second wire layer 150.

Referring to FIG. 2, when the FPC board 100 is connected to the OLED panel 200, the base substrate 210 of the OLED panel 200 overlaps the substrate 110 of the FPC board 100, such that the circuit board terminal 130 and the panel terminal 220 of the base substrate 210 are connected and the projection of an edge of a portion of the base substrate 210 overlapping the substrate 110 away from the center of the base substrate 210 on the FPC board 100 overlaps with the circuit board terminal 130. Due to the limitation of the process, when the FPC board 100 is connected to the OLED panel 200, the connection fixture will bend the FPC board 100 such that the edge of the portion of the base substrate 210 overlapping the FPC board 100 away from the center of the base substrate 210 is in contact with the circuit board terminal 130. The PI material at the edge of the base substrate 210 of the OLED panel 200 acquired by laser cutting may be seriously carbonized to become a conductor, such a short circuit may occur when the edge of the base substrate 210 is in contact with the circuit board terminal 130 to generate the heat that burns the FPC board 100 and the OLED panel 200. The carbonized PI cannot be removed by simple physical cleaning, and the use of a new cleaning method leads to an increase in equipment cost.

SUMMARY OF INVENTION

One object of the present invention is to provide a flexible printed circuit (FPC) board capable of preventing a short circuit between a circuit board terminal and an organic light-emitting diode (OLED) panel when the FPC board is connected to the OLED panel, thereby improving the product quality.

Another object of the present invention is to provide a method for manufacturing a FPC board capable of preventing a short circuit between a circuit board terminal and an OLED panel when the manufactured FPC board is connected to the OLED panel, thereby improving the product quality.

Another object of the present invention is to provide an OLED display device capable of preventing a short circuit between a circuit board terminal of a FPC board and an OLED panel, thereby improving the product quality.

In order to achieve the foregoing objects, the present invention firstly provides a FPC board including a substrate, a first wire layer disposed on one side of the substrate, a circuit board terminal disposed at an edge on the one side of the substrate and connected to the first wire layer, and a first protective layer covering the first wire layer, wherein the thickness of the circuit board terminal is larger than the sum of the thickness of the first wire layer and the thickness of the first protective layer.

In one embodiment, the FPC board further includes a second wire layer disposed on the other side of the substrate and a second protective layer covering the second wire layer.

In one embodiment, the first wire layer and the second wire layer include copper; and the first protective layer and the second protective layer include polyimide (PI).

In one embodiment, the circuit board terminal includes a conductive bump disposed at an edge on the one side of the substrate and connected to the first wire layer, and a conductive film disposed on the conductive bump.

In one embodiment, the thickness of the conductive bump is larger than the sum of the thickness of the first wire layer and the thickness of the first protective layer; and the conductive bump and the first wire layer include the same material.

In one embodiment, the conductive film is formed by electroplating on the conductive bump.

The present invention further provides a method for manufacturing a flexible printed circuit (FPC) board, including the steps of:

Step S1, providing a substrate;

Step S2, forming and patterning a first conductive material film on one side of the substrate to form a first wire layer and a terminal pattern connected to the first wire layer and disposed at an edge on the one side of the substrate;

Step S3, manufacturing a conductive material pattern on the terminal pattern to form a conductive bump connected to the first wire layer and disposed at an edge on the one side of the substrate;

Step S4, covering the first protective layer on the first wire layer; and

Step S5, manufacturing a conductive film on the conductive bump to form a circuit board terminal including the conductive bump and the conductive film.

In one embodiment, Step S2 further forms and patterns a second conductive material film on the other side of the substrate to form a second wire layer; and Step S4 further covers the second protective layer on the second wire layer.

In one embodiment, in Step S2, the first conductive material film is formed on the one side of the substrate by hot pressing; in Step S3, the conductive material pattern is manufactured on the terminal pattern by hot pressing to form the conductive bump; and in Step S5, the conductive film is manufactured on the conductive bump by electroplating.

The present invention further provides an OLED display device, including an OLED panel and a FPC board electrically connected to the OLED panel, wherein the FPC board is the FPC board described above, and the OLED panel includes a base substrate and a panel terminal disposed at an edge on one side of the base substrate, the one side of the base substrate on which the panel terminal is provided is opposite to the one side of the substrate on which the circuit board terminal is provided, the base substrate overlaps with the substrate such that the circuit board terminal is connected to the panel terminal, and the projection of an edge of a portion of the base substrate overlapping the substrate away from the center of the base substrate on the FPC board overlaps with the first protective layer.

Beneficial effects of the present invention—the FPC board according to the present invention includes a substrate, a first wire layer disposed on one side of the substrate, a circuit board terminal disposed at an edge on the one side of the substrate and connected to the first wire layer, and a first protective layer covering the first wire layer, wherein the thickness of the circuit board terminal is larger than the sum of the thickness of the first wire layer and the thickness of the first protective layer. When the FPC board is connected to the OLED panel, the one side of the base substrate on which the panel terminal is provided is opposite to the one side of the substrate on which the circuit board terminal is provided, such that the base substrate overlaps with the substrate to connect the circuit board terminal and the panel terminal. The projection of an edge of a portion of the base substrate overlapping the substrate away from the center of the base substrate on the FPC board overlaps with the first protective layer, which can effectively prevent the edge of the base substrate from being in contact with the circuit board terminal to cause a short circuit, thereby improving the product quality. The method for manufacturing the FPC board according to the present invention can prevent a short circuit between the circuit board terminal and the OLED panel when the manufactured FPC board is connected with the OLED panel, thereby improving the product quality. The OLED display device according to the present invention can prevent a short circuit between the circuit board terminal of the FPC board and the OLED panel, thereby improving the product quality.

DESCRIPTION OF DRAWINGS

For a better understanding of the features and technical aspects of the present invention, please refer to the following detailed description and accompanying drawings of the present invention. However, the accompanying drawings are only for reference and description, and are not intended to limit the present invention. Among the accompanying drawings.

DETAILED DESCRIPTION OF PREFERRED EMBODIMENTS

In order to further clarify the technical means adopted by the present invention and its effects, the following is a detailed description in conjunction with preferred embodiments of the present invention and the accompanying drawings.

Figure 1:
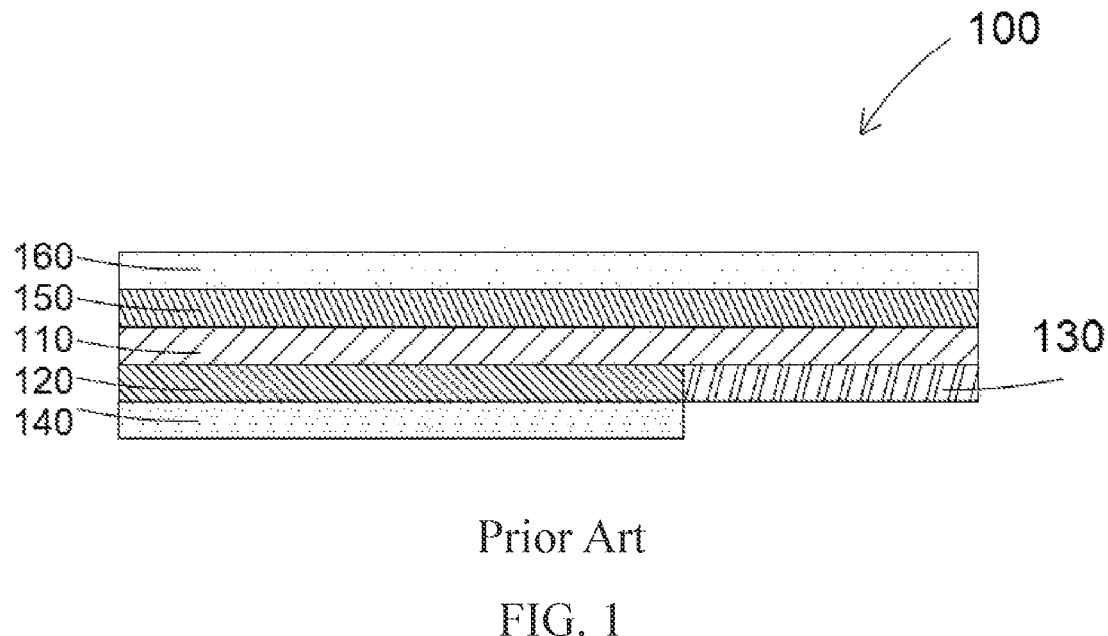
FIG. 1 is a schematic structural diagram of a conventional FPC board.
Figure 2:
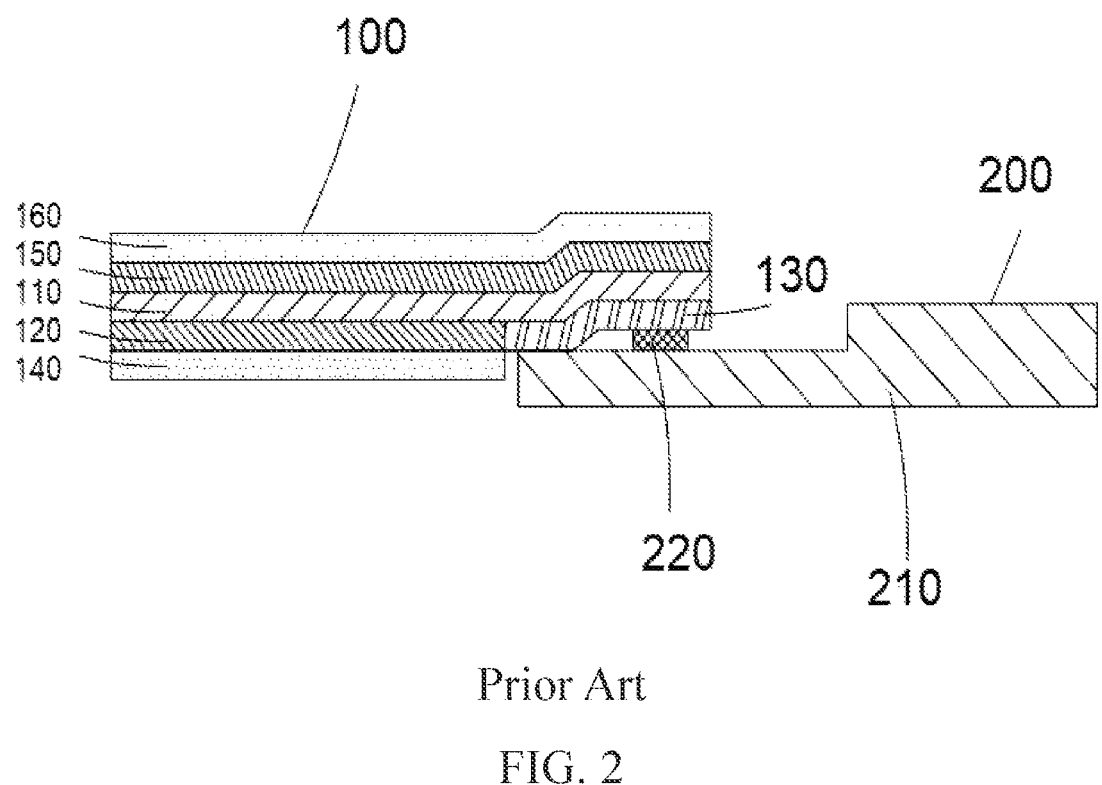
FIG. 2 is a schematic diagram showing the connection between the FPC board in FIG. 1 and an OLED panel.
Figure 3:
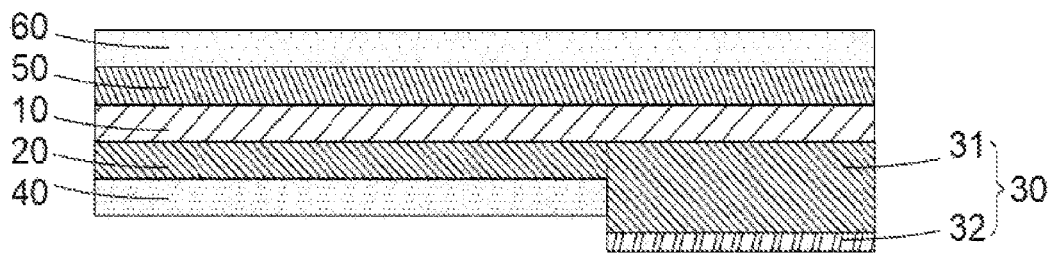
FIG. 3 is a schematic structural diagram of a FPC board according to the present invention.

Referring to FIG. 3, the present invention provides a FPC board including a substrate 10, a first wire layer 20 disposed on one side of the substrate 10, a circuit board terminal 30 disposed at an edge on the one side of the substrate 10 and connected to the first wire layer 20, and a first protective layer 40 covering the first wire layer 20. The thickness of the circuit board terminal 30 is larger than the sum of the thickness of the first wire layer 20 and the thickness of the first protective layer 40.

Specifically, the circuit board terminal 30 includes a conductive bump 31 disposed at an edge on the one side of the substrate 10 and connected to the first wire layer 20, and a conductive film 32 disposed on the conductive bump 31. The thickness of the conductive bump 31 is larger than the sum of the thickness of the first wire layer 20 and the thickness of the first protective layer 40.

Furthermore, the conductive bump 31 and the first wire layer 20 can include the same material.

Specifically, the conductive film 32 may be formed by electroplating on the conductive bump 31.

Specifically, the FPC board further includes a second wire layer 50 disposed on the other side of the substrate 10 and a second protective layer 60 covering the second wire layer 50.

Specifically, the first wire layer 20 and the second wire layer 50 may include copper or other low-resistance wire material.

Specifically, the first protective layer 40 and the second protective layer 60 may include polyimide (PI).

Figure 8:
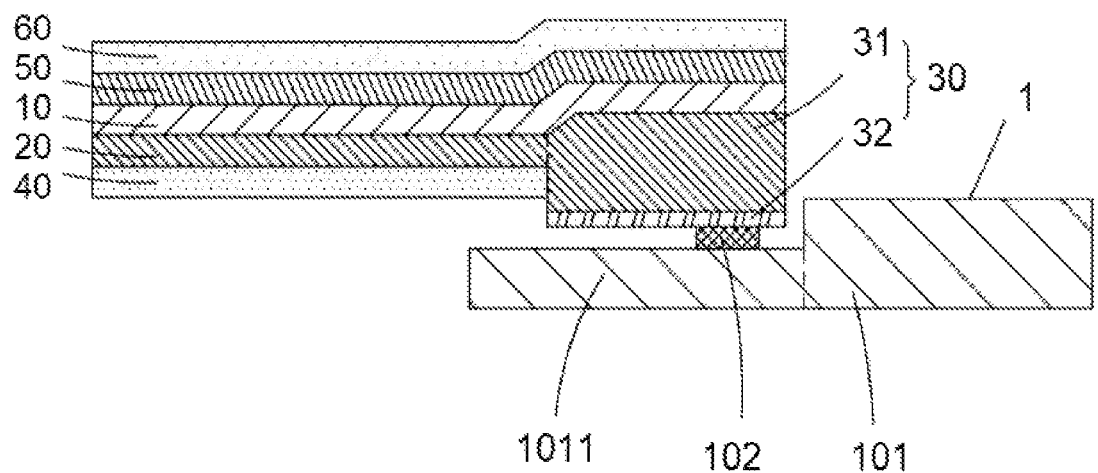
FIG. 8 is a schematic structural diagram of an OLED display device according to the present invention.

Specifically, with reference to FIG. 8, the FPC board of the present invention is configured to electrically connect the OLED panel 1 to transmit a test signal thereto. The OLED panel 1 includes a base substrate 101 and a panel terminal 102 disposed at an edge on one side of the base substrate 101. The one side of the base substrate 101 on which the panel terminal 102 is provided is opposite to the one side of the substrate 10 on which the circuit board terminal 30 is provided. The base substrate 101 overlaps with the substrate 10 such that the circuit board terminal 30 is connected to the panel terminal 102 to electrically connect the FPC board and the OLED panel 1. The projection of an edge of a portion of the base substrate 101 overlapping the substrate 10 away from the center of the base substrate 101 on the FPC board overlaps with the first protective layer 40. The base substrate 101 includes a rigid substrate and a flexible substrate (not shown) which are sequentially disposed. The panel terminal 102 is disposed on the flexible substrate. The OLED panel 1 is manufactured by laser cutting, such that the flexible substrate material at the edge of the substrate 101 is carbonized.

It should be noted that, on the FPC board according to the present invention, the thickness of the circuit board terminal 30 for contacting the panel terminal of the OLED panel 1 is larger than the sum of the thickness of the first wire layer 20 connected to the circuit board terminal 30 and the thickness of the first protective layer 40. By designing the size of the first protective layer 40 such that the FPC board is electrically connected to the OLED panel 1, the projection of an edge of a portion of the base substrate 101 overlapping the substrate 10 away from the center of the base substrate 101 on the FPC board overlaps with the first protective layer 40. As a result, when the FPC board is deformed by the connection fixture, the edge of the portion of the base substrate 101 overlapping the substrate 10 away from the center of the base substrate 101 is in contact with the first protective layer 40, instead of the circuit board terminal 30. Moreover, the connection between the circuit board terminal 30 and the panel terminal 102 is not affected by the deformation of the FPC board even if the flexible substrate material at the edge of the base substrate 101 is made conductive due to carbonization. Since the edge of the base substrate 101 is not in contact with the circuit board terminal 30, there will not be any short circuit between the base substrate 101 and the circuit board terminal 30, and the product quality is improved.

Figure 4:
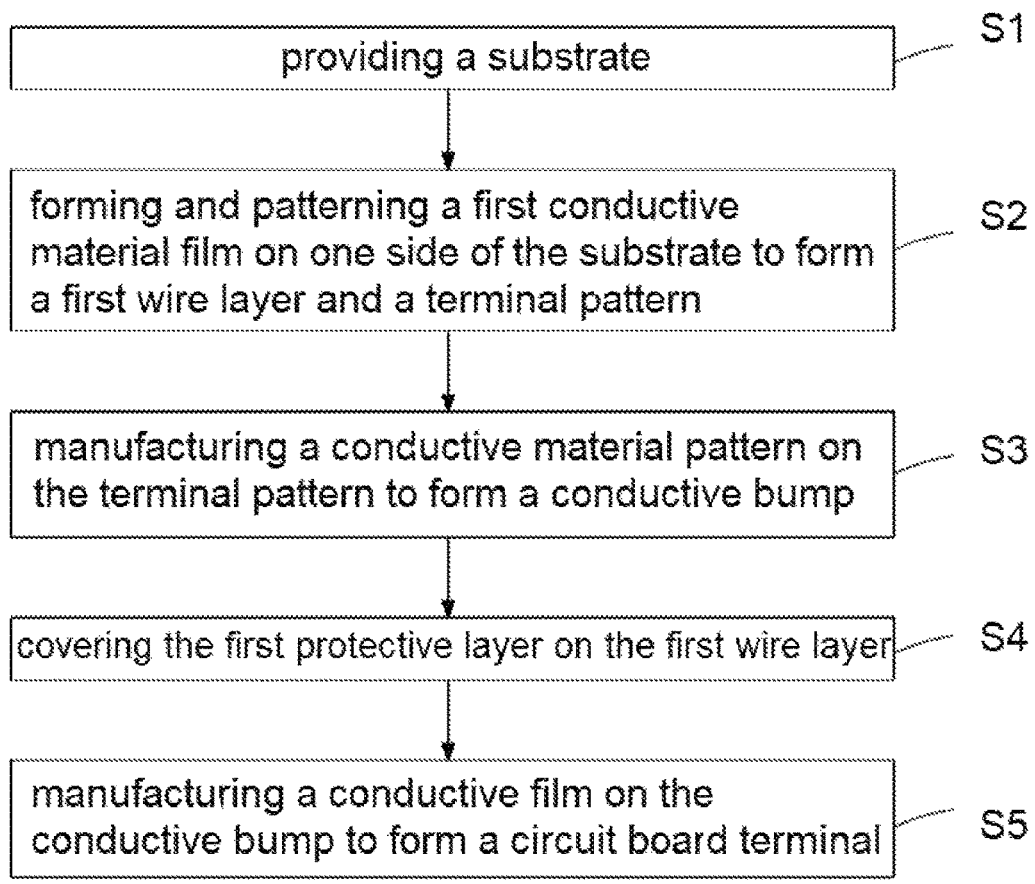
FIG. 4 is a flowchart of a method for manufacturing a FPC board according to the present invention.
Figure 5:
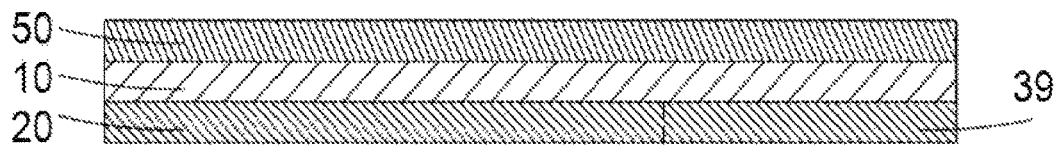
FIG. 5 is a schematic diagram of Step S2 of a method for manufacturing a FPC board according to the present invention.

Referring to FIG. 4, the present invention further provides a method for manufacturing the FPC board described above, which includes the following steps:

In Step S1, referring to FIG. 5, a substrate 10 is provided.

In Step S2, referring to FIG. 5, a first conductive material film is formed and patterned on one side of the substrate 10 to form a first wire layer 20 and a terminal pattern 39 connected to the first wire layer 20 and disposed at an edge on the one side of the substrate 10.

Specifically, in Step S2, the first conductive material film is formed on the one side of the substrate 10 by hot pressing.

Specifically, Step S2 further forms and patterns a second conductive material film on the other side of the substrate 10 to form a second wire layer 50.

Figure 6:
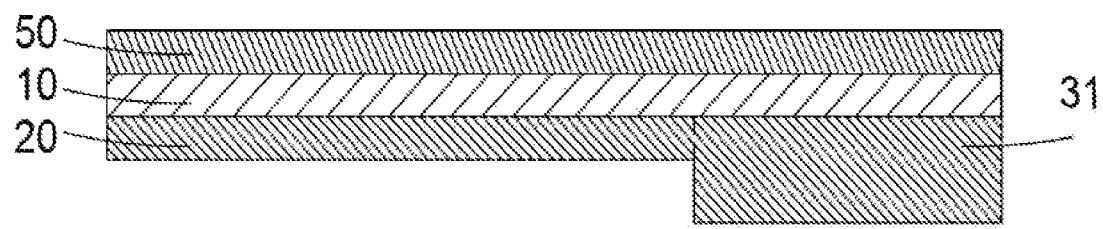
FIG. 6 is a schematic diagram of Step S3 of a method for manufacturing a FPC board according to the present invention.

In Step S3, referring to FIG. 6, a conductive material pattern is manufactured on the terminal pattern 39 to form a conductive bump 31 connected to the first wire layer 20 and disposed at an edge on the one side of the substrate 10.

Specifically, in Step S3, the conductive material pattern is manufactured on the terminal pattern 39 by hot pressing to form the conductive bump 31.

Figure 7:
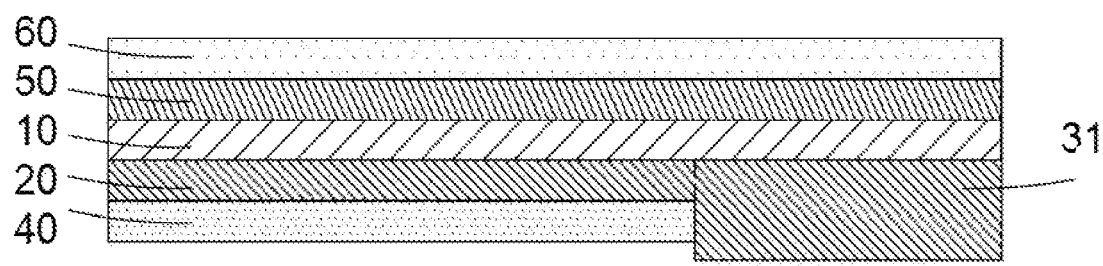
FIG. 7 is a schematic diagram of Step S4 of a method for manufacturing a FPC board according to the present invention.

In Step S4, referring to FIG. 7, the first protective layer 40 is covered on the first wire layer 20.

Specifically, the Step S4 further covers the second protective layer 60 on the second wire layer 50.

In Step S5, referring to FIG. 8, a conductive film 32 is manufactured on the conductive bump 31 to form a circuit board terminal 30 including the conductive bump 31 and the conductive film 32.

Specifically, in Step S5, the conductive film 32 is manufactured on the conductive bump 31 by electroplating.

It should be noted that, on the FPC board manufactured by the method for manufacturing a FPC board according to the present invention, the thickness of the circuit board terminal 30 for contacting the panel terminal of the OLED panel 1 is larger than the sum of the thickness of the first wire layer 20 connected to the circuit board terminal 30 and the thickness of the first protective layer 40. By designing the size of the first protective layer 40 such that the FPC board is electrically connected to the OLED panel 1, the projection of an edge of a portion of the base substrate 101 overlapping the substrate 10 away from the center of the base substrate 101 on the FPC board overlaps with the first protective layer 40. As a result, when the FPC board is deformed by the connection fixture, the edge of the portion of the base substrate 101 overlapping the substrate 10 away from the center of the base substrate 101 is in contact with the first protective layer 40, instead of the circuit board terminal 30. Moreover, the connection between the circuit board terminal 30 and the panel terminal 102 is not affected by the deformation of the FPC board even if the flexible substrate material at the edge of the base substrate 101 is made conductive due to carbonization. Since the edge of the base substrate 101 is not in contact with the circuit board terminal 30, there will not be any short circuit between the base substrate 101 and the circuit board terminal 30, and the product quality is improved.

Based on the same inventive concept, referring to FIG. 8, the present invention further provides an OLED display device, including an OLED panel 1 and a FPC board electrically connected to the OLED panel 1.

The FPC board is the FPC board described above, and the structure of the FPC board is not repeatedly described herein.

The OLED panel 1 includes a base substrate 101 and a panel terminal 102 disposed at an edge on one side of the base substrate 101. The one side of the base substrate 101 on which the panel terminal 102 is provided is opposite to the one side of the substrate 10 on which the circuit board terminal 30 is provided. The OLED panel 1 is fabricated by laser cutting, which causes carbonization of the flexible substrate material at the edge of the substrate 101. The base substrate 101 overlaps with the substrate 10 such that the circuit board terminal 30 is connected to the panel terminal 102. The projection of an edge of a portion of the base substrate 101 overlapping the substrate 10 away from the center of the base substrate 101 on the FPC board overlaps with the first protective layer 40.

Specifically, the base substrate 101 includes a terminal region 1011 disposed at an edge. The panel terminal 102 is disposed in the terminal region 1011. The thickness of the base substrate 101 in the terminal region 1011 is smaller than the thickness of the base substrate 101 outside the terminal region 1011. A portion of the base substrate 101 overlapping the substrate 10 is disposed in the terminal region 1011.

It should be noted that, on the FPC board in the OLED display device according to the present invention, the thickness of the circuit board terminal 30 for contacting the panel terminal of the OLED panel 1 is larger than the sum of the thickness of the first wire layer 20 connected to the circuit board terminal 30 and the thickness of the first protective layer 40. By designing the size of the first protective layer 40, the projection of an edge of a portion of the base substrate 101 overlapping the substrate 10 away from the center of the base substrate 101 on the FPC board overlaps with the first protective layer 40. As a result, when the FPC board is deformed by the connection fixture, the edge of the portion of the base substrate 101 overlapping the substrate 10 away from the center of the base substrate 101 is in contact with the first protective layer 40, instead of the circuit board terminal 30. Moreover, the connection between the circuit board terminal 30 and the panel terminal 102 is not affected by the deformation of the FPC board even if the flexible substrate material at the edge of the base substrate 101 is made conductive due to carbonization. Since the edge of the base substrate 101 is not in contact with the circuit board terminal 30, there will not be any short circuit between the base substrate 101 and the circuit board terminal 30, and the product quality is improved.

In summary, the FPC board according to the present invention includes a substrate, a first wire layer disposed on one side of the substrate, a circuit board terminal disposed at an edge on the one side of the substrate and connected to the first wire layer, and a first protective layer covering the first wire layer, wherein the thickness of the circuit board terminal is larger than the sum of the thickness of the first wire layer and the thickness of the first protective layer. When the FPC board is connected to the OLED panel, the one side of the base substrate on which the panel terminal is provided is opposite to the one side of the substrate on which the circuit board terminal is provided, such that the base substrate overlaps with the substrate to connect the circuit board terminal and the panel terminal. The projection of an edge of a portion of the base substrate overlapping the substrate away from the center of the base substrate on the FPC board overlaps with the first protective layer, which can effectively prevent the edge of the base substrate from being in contact with the circuit board terminal to cause a short circuit, thereby improving the product quality. The method for manufacturing the FPC board according to the present invention can prevent a short circuit between the circuit board terminal and the OLED panel when the manufactured FPC board is connected with the OLED panel, thereby improving the product quality. The OLED display device according to the present invention can prevent a short circuit between the circuit board terminal of the FPC board and the OLED panel, thereby improving the product quality.

In the above, for those with ordinary skill in the art, various other changes and modifications can be made according to the technical solutions and technical concept of the present invention, and all such changes and modifications are within the scope of the claims of the present invention.

What is claimed is:

1. A flexible printed circuit (FPC) board, comprising a substrate, a first wire layer disposed on one side of the substrate, a circuit board terminal disposed at an edge on the one side of the substrate and connected to the first wire layer, and a first protective layer covering the first wire layer, wherein
  the thickness of the circuit board terminal is larger than the sum of the thickness of the first wire layer and the thickness of the first protective layer.

2. The FPC board of claim 1, further comprising a second wire layer disposed on the other side of the substrate and a second protective layer covering the second wire layer.

3. The FPC board of claim 2, wherein
  the first wire layer and the second wire layer comprise copper; and
  the first protective layer and the second protective layer comprise polyimide (PI).

4. The FPC board of claim 1, wherein the circuit board terminal comprises a conductive bump disposed at an edge on the one side of the substrate and connected to the first wire layer, and a conductive film disposed on the conductive bump.

5. The FPC board of claim 4, wherein
  the thickness of the conductive bump is larger than the sum of the thickness of the first wire layer and the thickness of the first protective layer; and
  the conductive bump and the first wire layer include the same material.

6. The FPC board of claim 4, wherein the conductive film is formed by electroplating on the conductive bump.

7. An organic light-emitting diode (OLED) display device, comprising an OLED panel and a flexible printed circuit (FPC) board electrically connected to the OLED panel, wherein
  the FPC board is the FPC board of claim 1; and
  the OLED panel comprises a base substrate and a panel terminal disposed at an edge on one side of the base substrate, the one side of the base substrate on which the panel terminal is provided is opposite to the one side of the substrate on which the circuit board terminal is provided, the base substrate overlaps with the substrate such that the circuit board terminal is connected to the panel terminal, and the projection of an edge of a portion of the base substrate overlapping the substrate away from the center of the base substrate on the FPC board overlaps with the first protective layer.

8. A method for manufacturing a flexible printed circuit (FPC) board, comprising the steps of:
  Step S1, providing a substrate;
  Step S2, forming and patterning a first conductive material film on one side of the substrate to form a first wire layer and a terminal pattern connected to the first wire layer and disposed at an edge on the one side of the substrate;
  Step S3, manufacturing a conductive material pattern on the terminal pattern to form a conductive bump connected to the first wire layer and disposed at an edge on the one side of the substrate;
  Step S4, covering the first protective layer on the first wire layer; and
  Step S5, manufacturing a conductive film on the conductive bump to form a circuit board terminal comprising the conductive bump and the conductive film;
  wherein in Step S2, the first conductive material film is formed on the one side of the substrate by hot pressing;

in Step S3, the conductive material pattern is manufactured on the terminal pattern by hot pressing to form the conductive bump; and in Step S5, the conductive film is manufactured on the conductive bump by electroplating.

9. The method for manufacturing a FPC board of claim 8, wherein

Step S2 further forms and patterns a second conductive material film on the other side of the substrate to form a second wire layer; and Step S4 further covers the second protective layer on the second wire layer.

* * * * *